(12) United States Patent
Rahim et al.

(10) Patent No.: US 8,084,871 B2
(45) Date of Patent: Dec. 27, 2011

(54) REDISTRIBUTION LAYER ENHANCEMENT TO IMPROVE RELIABILITY OF WAFER LEVEL PACKAGING

(75) Inventors: S. Kaysar Rahim, Dallas, TX (US); Tiao Zhou, Carrollton, TX (US); Arkadii Samoilov, Sartoga, CA (US); Viren Khandekar, Flower Mound, TX (US); Yong Li Xu, Plano, TX (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 81 days.

(21) Appl. No.: 12/616,077

(22) Filed: Nov. 10, 2009

(65) Prior Publication Data
US 2011/0108981 A1    May 12, 2011

(51) Int. Cl.
*H01L 23/48* (2006.01)
*H01L 23/52* (2006.01)
*H01L 29/40* (2006.01)

(52) U.S. Cl. ........................................ 257/784; 257/780

(58) Field of Classification Search .................. 257/784, 257/786, 780, 781
See application file for complete search history.

(56) References Cited

U.S. PATENT DOCUMENTS

| | | |
|---|---|---|
| 2008/0169539 A1* | 7/2008 | Fang et al. .................... 257/676 |
| 2008/0248614 A1 | 10/2008 | Yang et al. |
| 2008/0308934 A1 | 12/2008 | Alvarado et al. |
| 2009/0057887 A1* | 3/2009 | Mclellan et al. .............. 257/737 |
| 2009/0174069 A1 | 7/2009 | Nguyen et al. |
| 2010/0181642 A1* | 7/2010 | Sarfaraz et al. ............... 257/528 |
| 2011/0049725 A1* | 3/2011 | Topacio et al. ............... 257/773 |

OTHER PUBLICATIONS

PCT: International Search Report and Written Opinion of the International Searching Authority for PCT/US2010/056116 (counterpart application); Jun. 27, 2011; 11 pages.

* cited by examiner

*Primary Examiner* — Sheila V Clark
(74) *Attorney, Agent, or Firm* — Howison & Arnott, L.L.P.

(57) ABSTRACT

An enhanced redistribution layer is provided that geometrically expands redistribution layer (RDL) pads associated with a ball grid array of a wafer level package (WLP) to provide tensile stress relief during temperature cycle and/or drop testing of the WLP.

18 Claims, 6 Drawing Sheets

US 8,084,871 B2

REDISTRIBUTION LAYER ENHANCEMENT TO IMPROVE RELIABILITY OF WAFER LEVEL PACKAGING

CROSS-REFERENCE TO RELATED APPLICATIONS

N/A

TECHNICAL FIELD

Embodiments of the invention relate to wafer level packaging (WLP) for silicon dies having solder bump grid arrays. More particularly, embodiments of the invention relate to WLPs incorporating redistribution layer (RDL) pad extensions, wings or expanded geometries extending outward from an RDL pad in a direction toward an exterior edge of a silicon die or inward toward the center of the silicon die in order to spread solder joint tension stresses about a solder joint location thereby decreasing device failures due to temperature cycling (TC) and drop testing (DT) of a ball grid array WLP device.

BACKGROUND

As the size of wafer level package devices increases, the array of solder connections between the wafer level package (WLP) device and a printed circuit board also increases. Referring to FIG. 1, a portion of a bottom or underside view of an under bump metal to solder ball interface is shown. In particular, FIG. 1 shows an under bump metal to solder joint interface within a solder joint array that is located adjacent to a wafer level package corner. For clarity, the solder ball is not depicted in FIG. 1. FIG. 2 is a cut away view along cut away line A of FIG. 1. Referring now to both FIGS. 1 and 2, a portion of a prior art wafer level package 100 is shown. FIG. 2 depicts various material layers associated with the WLP 100. A silicon layer 102 is shown. Within the silicon layer 102 is the active area 104 of the silicon layer wherein on chip semiconductor circuitry is found. The active area 104 ends near each edge of a WLP resulting in a narrow edge area or inactive area 106 that extends about the exterior edges or periphery of the WLP 100 as shown in FIG. 1. Underneath the silicon layer 102 and the active area 104 is a passivation layer 108. The passivation layer is an oxide material that essentially insulates the semiconductor circuitry (not specifically shown) within the active area 104 of the silicon layer 102. Next to the passivation layer 108 is a dielectric layer 110. Within the dielectric layer 110 is a redistribution layer (RDL) 112. The RDL 112 is a metal layer that is responsible for electrically connecting the semiconductor circuitry within the silicon 102 to an exterior connection, for example, to a solder ball 124 and in turn a PC board.

In some WLP devices, the dielectric layer 110 is put down in two separate layers or steps, shown via the dotted line between the two areas indicated as being the dielectric layer 110. The redistribution layer 112 depicted comprises RDL pads and signal trace lines (not specifically shown). Against an RDL pad 112 is an underbump layer (UBM) 116 having a cupped shape such that a solder ball 124 can be easily placed on the UBM 116. The UBM 116 depicted is sometimes referred to as a UBM pad 116. An inner diameter 122 of the UBM 116 is sometimes referred to as the dielectric opening diameter 122, which allows for electromigration of signals, currents and voltages to and from the active circuitry on the silicon 102 via the UBM pad 116 and the RDL pad 112. The RDL pad 112 is electrically connected to the active circuitry within the silicon 102. In some prior art devices, the UBM pad diameter 118 is the same or similar in size to the RDL pad diameter 114. In other prior art, the UBM pad diameter is about zero to 10 microns larger than the RDL pad diameter. As shown, there is some amount of dielectric that separates the RDL lip or edge 115 from the UBM lip or edge. Generally, in prior art devices, the RDL lip 115 has a radial width of from about 0 to about 13 microns.

As wafer level packages become larger their associated solder ball grid arrays or solder joint arrays have also increased in dimension. As the solder ball grid arrays become larger than 7×7 it was found that the prior art wafer level packages began to fail and become less reliable during temperature cycle (TC) testing and drop testing (DT). The TC and DT tests are common reliability tests performed on WLP devices to ensure that they meet minimum reliability standards. During both the TC and the DT testing, the larger WLPs exhibit a die level crack more frequently as the size of the WLP package increase length, width and solder ball count.

Referring to FIG. 3, a prior art WLP structure 100 is shown having both a primary 300 and secondary 306 crack depicted. The primary failure mode of the prior art WLP structure 100 during a temperature cycle and/or drop test is due to a dielectric and passivation layer crack. The primary crack 300 initializes at an upper edge portion of the RDL lip 115. The initialization of this crack during the temperature cycling is believed to be due to the differing coefficients of expansion and contraction of the various layers of materials near and about the solder ball 124, the solder joint and the printed circuit card connection.

There is a high tensile stress concentration created during the TC and drop tests. This stress concentration transfers from the strong UBM pad 116 to the RDL pad 112, which shifts the stress via the RDL lip 115 into the dielectric 110. It is common that the dielectric crack initiates at the RDL lip 115 and then propagates toward the passivation layer 108. In short, during temperature cycling, stress accumulates in the solder joints and shifts to the dielectric layer 110 through the RDL edge 115. As shown, the crack can extend through the dielectric layer and then through the passivation layer at 302 when the crack continues into the silicon 102 and active circuit area (see 304), a circuit failure results.

It is the tensile stress concentration that develops during the TC loading due to the coefficient of thermal expansion mismatch between the printed circuit board (not shown) and the WLP that causes the cracking and failure.

A secondary crack 306 often occurs, but the secondary crack does not create additional failure. The secondary crack 306 travels from the RDL lip 115 toward the UBM layer 116 and does not generally break any electrical connections.

Thus, a problem with prior art WLP devices is that the stress level on the RDL is too high during temperature cycling and drop testing causing a crack or failure through the dielectric layer 110 and into the integrated circuitry. What is needed is a method or mechanism that can decrease or spread the stress buildup on or around the RDL pads during temperature cycling and drop testing of WLPs having a grid array greater than a 7×7 solder joint connection array in order to increase the reliability and mean time between failure of such larger WLP die sizes being manufactured. There is a need for the reliability of large array wafer level packages (LAWLP) to withstand the stresses of temperature cycling and drop testing with high success rather than failure rates.

SUMMARY

In view of the limitations and shortcomings of the aforementioned prior art wafer level packaging solder joint construction, embodiments of the invention provide a means that reduces or spreads the stresses associated with temperature cycling and drop testing, about solder joint locations of LAWLP packages. Embodiments of the invention provide WLPs that have lower failure rates and greater product reliability with respect to inter layer cracking failures than prior art devices.

An embodiment of the invention provides a wafer level package that has an array of solder joint locations on a first side of the wafer level package. At least one of the solder joint locations on the first side of the wafer level package comprises an under ball metal (UBM) layer or pad that has a UBM diameter. Positioned underneath the UBM pad is a redistribution layer or pad that is adjacent to and against the UBM layer. The redistribution layer (RDL) or pad has a pad width and an RDL extension wing area. The RDL extension wing area extends from the RDL pad area in a direction that is both radially outward from the center of the RDL pad area and radially outward and/or radially inward toward a central location of the wafer level package.

In some embodiments, the at least one solder joint location comprises solder joint locations that are proximate or adjacent to one or more corners of the wafer level package.

In another embodiment, the at least one solder joint location comprises solder joint locations positioned about the periphery of the array of solder joint locations on the wafer level package. In yet another embodiment, the solder joint locations may include solder joint locations about the periphery of the array of solder joint locations as well as additional solder joint locations located adjacent to or in a row or column next to and inwardly located in the array of solder joint locations.

Additional embodiments of the invention have RDL extension wing areas that extend from the RDL pad area edge a radial distance of about 42 microns +/−28 microns. A total radial length of an RDL pad area plus an extension wing may be equal to the radial length of the associated UBM pad plus about 42 microns +/−about 28 microns.

Another embodiment provides a wafer level package that comprises a die, being rectangular or square and having a first side and a second side. An array of solder joint locations is organized on the first side of the die in rows and columns. The array of solder joint locations includes a redistribution layer (RDL) comprising a plurality of RDL pad locations that coincide with each solder joint location. Each RDL pad location has a pad diameter or width. The RDL pad locations, which coincide with the solder joint locations at the corners of the array, each comprise an expanded RDL geometry. Each expanded RDL geometry is substantially centered about an imaginary line extending radially from the center or near the center of the first side of the die through a center location of the solder joint location that coincides with the RDL pad location.

In another embodiment, the RDL pad locations, which coincide with a plurality peripheral solder joint locations about the array, each comprise an expanded RDL geometry that is substantially centered about an imaginary line extending radially from a central location on the first side of the die through the center location of the solder joint location coinciding with the particular RDL pad location.

In some embodiments, the expanded RDL geometry may be changed or adapted from being centered about a line when an adjacent signal trace or RDL signal trace requires at least some of the same area as the centered RDL geometry.

In various embodiments, the expanded RDL geometry has a width that is about equal to the RDL pad diameter plus about 0 to 20 microns. The length of an expanded RDL geometry may be measured from the center of the solder joint location and have a length equal to a radius of the associated UBM pad plus 0 to 70 microns.

Another embodiment comprises a silicon wafer having one or more integrated circuit dies manufactured thereon. A die on the silicon wafer is bordered on each side by streets that represent expendable portions where the silicon wafer will be cut. The die or the wafer comprises an array of RDL pads that each correspond to an under ball metal pad. Each under ball metal (UBM) pad has a center location. A first plurality of the RDL pads, which are in or near a central area of the array, each comprise a circular geometry and have an RDL pad diameter. A second plurality of RDL pads, of the array of RDL pads, have positions about or within two UBM pads of the periphery of the array. The RDL pads having positions about or within two UBM pads of the periphery of the array each comprise a geometry having a length measured along a first line extending radially from a central location of the die through a corresponding UBM pad's center location and a width measured along a second line that is perpendicular to the first line and also extending through the corresponding UBM pad's center location. The width of the geometry may be equal to the RDL pad diameter plus 0 to about 20 microns and the length of the geometry may be equal to the RDL pad diameter plus about 14 to about 140 microns. The length of the RDL pad's geometry having positions about or within two UBM pads of the periphery of the array is not necessarily centered about its corresponding UBM center location.

Embodiments of the invention improve the temperature cycling and drop test reliability of wafer level packaging structures having a ball grid size of 8 by 8 or larger. Wings or extensions to the RDL layer that extend past the lip or edge of the UBM diameter in an inwardly radial and/or outwardly radial direction with respect to the center of a WLP package or die have been found to significantly decrease or spread the concentration of tensile stresses during drop testing and temperature cycling of LAWLP structures. The mean time between failure and product reliability was found to be improved in LAWLP structures significantly when the RDL layer was extended toward the edge or outside of the die for temperature cycling and when the RDL layer or edge was extended toward the center of a die for the drop testing. Product life and product reliability improves when embodiments of the invention are incorporated into LAWLP structures. It should be understood that LAWLP structures are considered structures having a solder joint array of 8 by 8 up to about 20 by 20.

BRIEF DESCRIPTION OF THE DRAWINGS

For a more complete understanding, reference is now made to the following description taken in conjunction with the accompanying Drawings in which.

DETAILED DESCRIPTION

Figure 1:
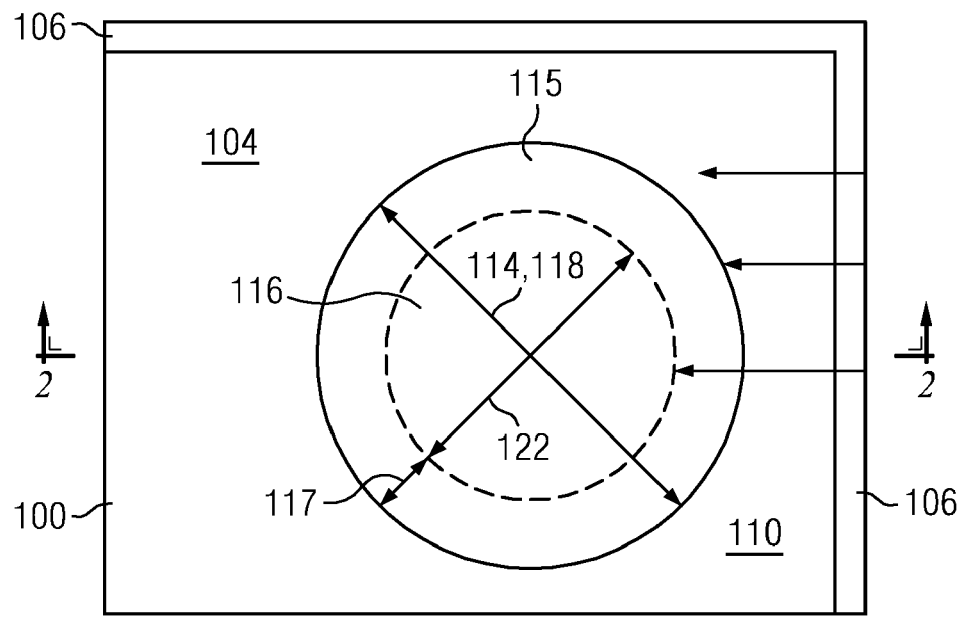
FIG. 1 illustrates a portion of a solder joint array of a prior art WLP.
Figure 2:
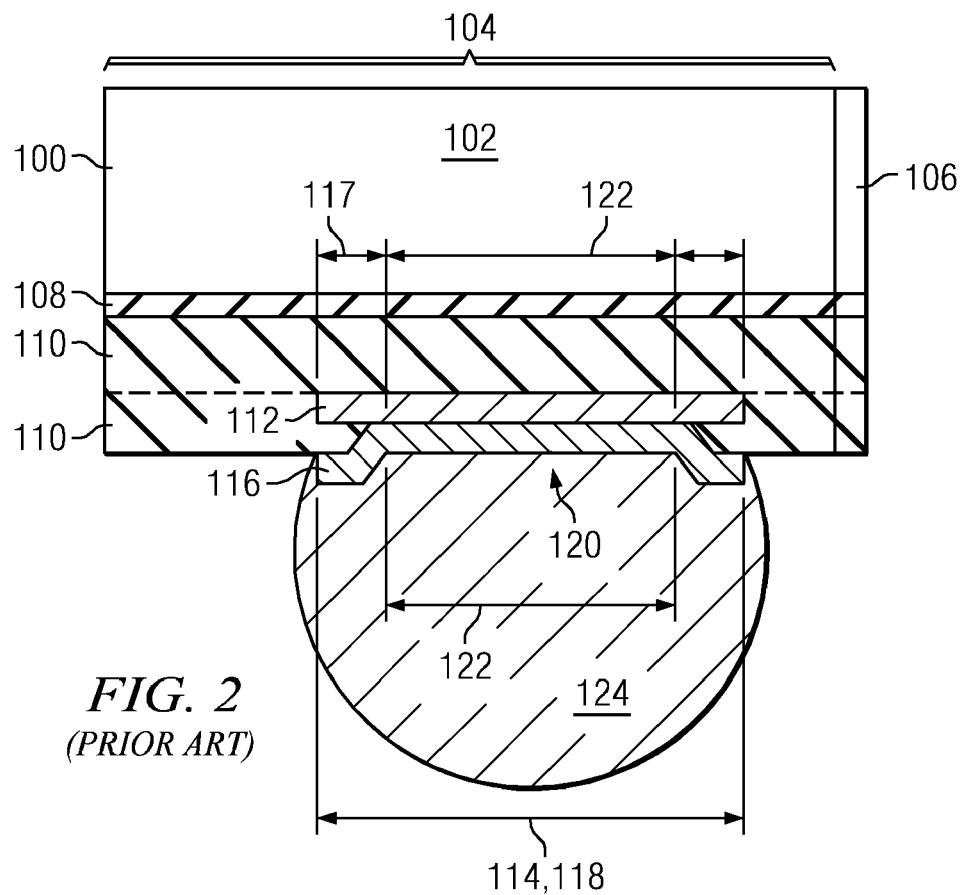
FIG. 2 illustrates a cutaway of the FIG. 1 prior art WLP.
Figure 3:
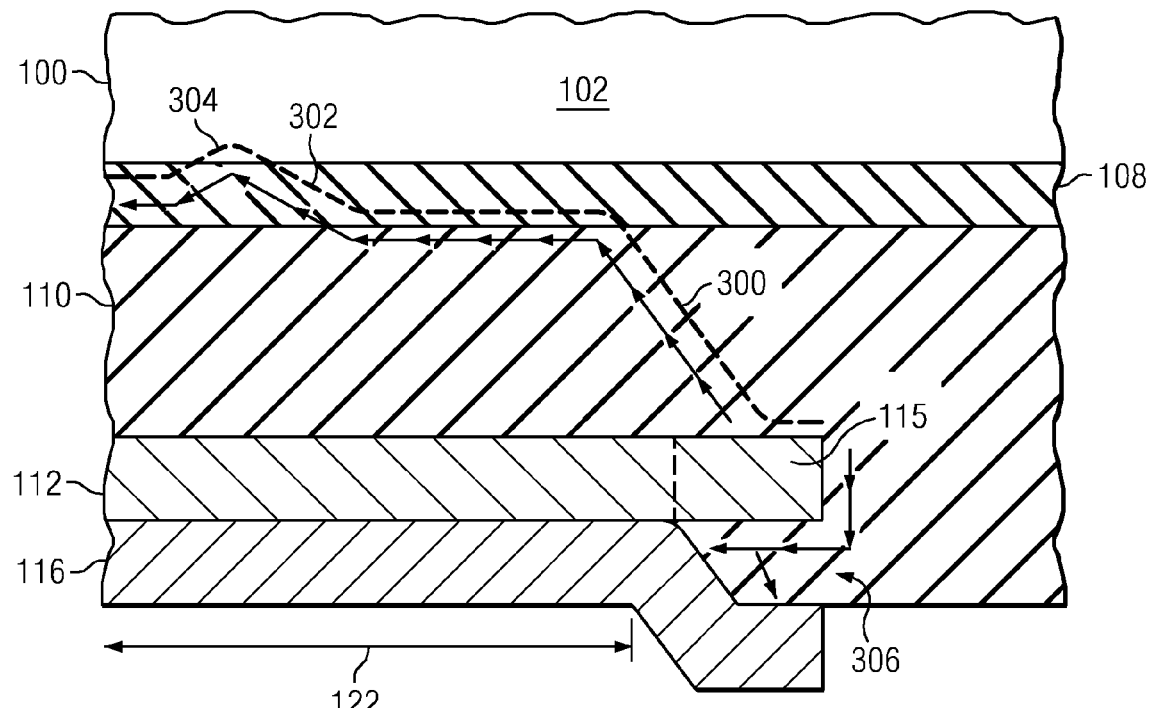
FIG. 3 illustrates a cutaway of a prior art WLP solder joint location with a failure crack.

Referring now to the drawings, wherein like reference numbers are used herein to designate like elements throughout, the various views and embodiments of a redistribution layer enhancement that improves the reliability of wafer level packaging are illustrated and described along with other possible embodiments. The figures are not necessarily drawn to scale, and in some instances the drawings have been exaggerated and/or simplified in places for illustrative purposes only. One of ordinary skill in the art will appreciate the many possible applications and variations based on the following examples of possible embodiments.

The interface between solder joints of wafer level packages (WLPs) and printed circuit boards have become strong enough that stress failures between printed circuit boards and integrated circuits have decreased. Such failures have moved to the die level of the integrated circuits during temperature cycling (TC) testing and drop testing (DT). The die level failures being observed during TC testing and DT testing include dielectric layer and passivation layer cracking, also known as inter layer dielectric (ILD) cracking. The most common failure mechanism during TC and DT testing is that a dielectric crack initiates at the RDL pad edge or lip and then propagates toward the silicon layer through the passivation layer and into the active circuit area of the silicon layer causing circuit failure. In order to reduce stresses on and about the RDL layer, embodiments of the invention increase the surface area and size of the RDL pads such that they extend outside of the UBM pad periphery. Embodiments extend the RDL pad layer outside the UBM pad diameter in predetermined radial directions or in some embodiments, circumferentially about the entire UBM pad. In some embodiments, the RDL pad is extended either radially inward, radially outward or both radially inward and outward with respect to the center of the die and about the UBM pad. The addition of such RDL extensions or wings about the RDL pad area has been found to reduce or spread RDL stress levels that cause dielectric cracking in prior WLP devices. Embodiments that minimize ILD cracking due to temperature changes and/or TC testing include RDL extensions, wings or geometric expansions that extend from RDL pad location in a direction that is radially outward from the center of a WLP die. Embodiments that minimize or eliminate ILD cracking due to impulse shocks or DT testing include RDL extensions, wings or geometric expansions that extend from RDL pad locations in a direction that is radially inward toward the WLP die center. Embodiments that minimize or eliminate ILD cracking for both TC testing and DT testing have RLD extensions, wings or geometric expansions extending both radially inward and radially outward toward and away from the WLP die center. In LAWLP packages, the solder joint corners and the array outer periphery solder joint locations must endure the highest stress concentration during TC and DT testing. In various embodiments of the invention, both TC and DT testing survival of exemplary LAWLP packages was improved by adding RDL extensions or wings directed both toward the outside and toward the inside of the die of the RDL locations on the periphery and in some embodiments only on the corner RDL locations of the solder joint array. An advantage of limiting the addition of RDL extensions or wings to the periphery solder joint locations on a WLP package is that the reliability of the overall WLP device is greatly improved while space remains between the interior solder joint locations for routing RDL signal traces within the array. Also, adding an RDL wing doesn't involve any dielectric opening 122 changes, thus there is no impact on electro-migration (EM) performance and testing.

Figure 4:
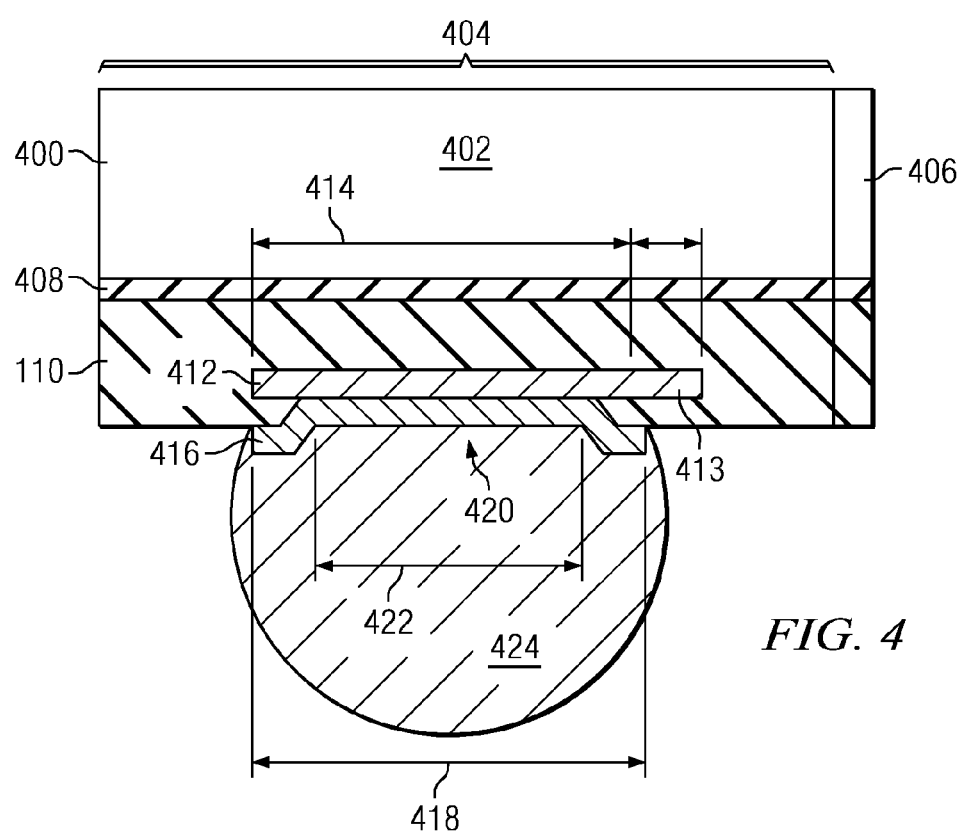
FIG. 4 illustrates a cutaway of an exemplary WLP joint location on an exemplary WLP device.
Figure 5:
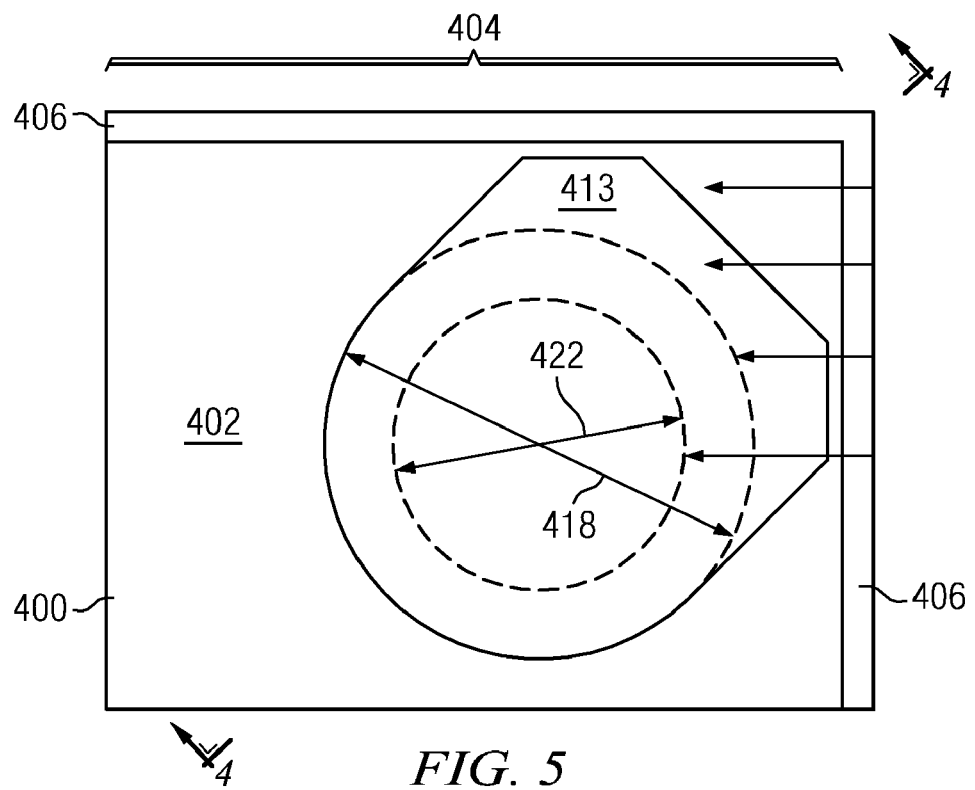
FIG. 5 illustrates a top view of a corner portion of an exemplary die having an RDL pad with expanded geometry or wing.

FIG. 4 is a cross-sectional view of an exemplary redistribution layer enhancement of a WLP package 400 along cross section line B of FIG. 5, which is a topical view of an exemplary corner solder joint location in accordance with an embodiment. The exemplary WLP 400 is made up of various material layers. The silicon layer 402 contains an active area of the silicon layer 404 wherein the integrated circuitry of a WLP package resides. An inactive area 406 extends about the edge or periphery of the exemplary die 400. A passivation layer 108, which is an oxide layer that protects the circuitry on the silicon layer's surface, separates the silicon layer 102 from the dielectric layer 110. An exemplary RDL pad layer 412 is provided and comprises an extension or RDL wing 413 extending beyond the periphery of the RDL pad diameter 414. The RDL pad 412 connects circuitry contained in the active area 404 with the UBM layer 416. The UBM pad 416 layer is where a solder ball 424 attaches to the WLP package 400. The UBM pad 416 has a diameter 418 that may be essentially the same as the UBM diameter 414 of prior art devices but may also be zero to about 20 microns smaller or larger in diameter. The dielectric opening 420 has an opening having a diameter 422 that is essentially the same as the prior art dielectric opening 122.

The surface area of the exemplary RDL pad layer 412 is seen to be increased via the extension 413. The increase in RDL surface area spreads the stress encountered by the RDL layer 412 encountered during TC testing. In other words, tensile forces are distributed over a larger area of the RDL 414 in the dielectric layer 110 as compared to the RDL structures of pre-existing devices.

Since the exemplary RDL pad layer 412 is part of the manufacturing process wherein the RDL layer is masked onto the die and then metal is sputtered or sprayed thereon, minimum additional cost is associated with masking and manufacturing exemplary WLP packages 400 that incorporate RDL pad layers 412 having extensions or wings 413. Thus the increase of RDL area in exemplary embodiments does not impact or substantially change the manufacturing cost of WLP packages.

As can be seen in FIG. 5, the RDL extension 413 extends in a radial direction and is centered about an imaginary line that extends radially from what would be the center of the die 400. It was found that during the TC test, the tension stress was maximally located adjacent to the RDL pad 412, radially centered with a line extending away from the center of the die extending through each RDL pad 412 and on the side of the RDL pad 412 nearer to the die edge. It is important for the RDL extension 413 to cover the tension portion of stress to thereby spread that stress out over the surface of the RDL extension 413 within the dielectric layer 110. By extending and spreading the tension stress over the surface of the RDL extension 413 it was found that failure due to TC testing was decreased, minimized and perhaps eliminated for the required TC specifications.

Figure 6:
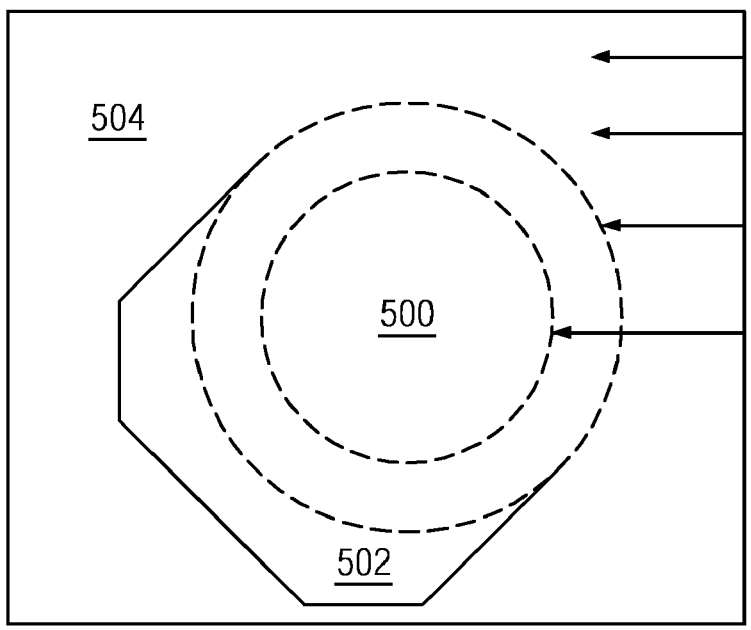
FIG. 6 illustrates a top view of a corner portion of an exemplary die having another exemplary RDL pad with expanded geometry or wing.

FIG. 6 depicts a WLP's corner solder joint location 500 having an RDL extension pad 502 extending radially inward toward the center of the die 504. For the drop test it was discovered that the tensile stress for each solder joint location is directed radially inward toward the center of the die. Thus, the RDL extension 502 is extended radially inward to spread the tensile stress associated with tensile from a drop test occurrence out and about the area of the RDL pad extension 502.

Figure 7:
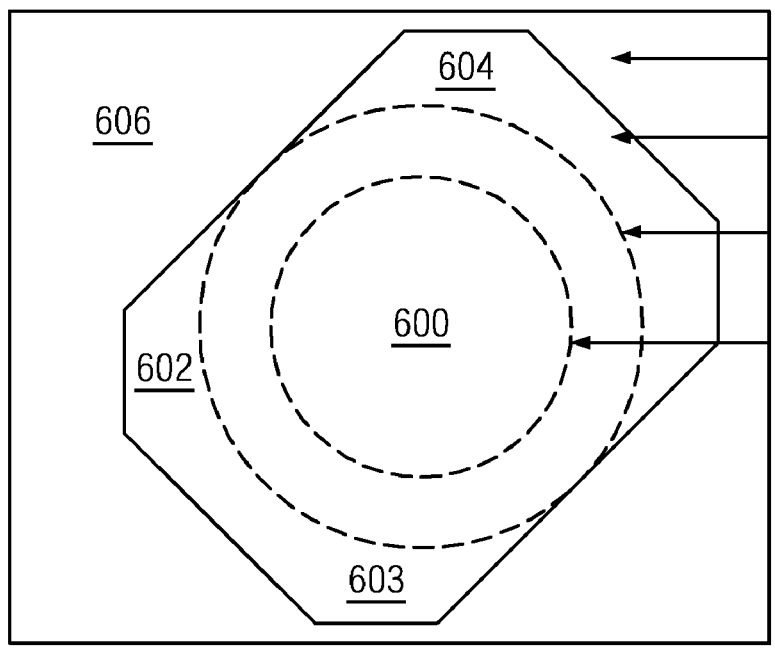
FIG. 7 illustrates a top view of a corner portion of an exemplary die having another exemplary RDL pad with expanded geometry or wings.

FIG. 7 depicts a solder joint location 600 positioned in a corner location of a WLP package. This embodiment comprises exemplary RDL wings extending radially inward 602 toward the center of the die 606 as well as extending radially outward 604 away from the center of the die 606. The entire RDL pad layer 603 being an RDL pad having an expanded geometry that is both radially inward toward and radially outward from a die's central location. This embodiment provides a level of protection and spreading of tensile stresses in WLP packages to help withstand the rigors of both temperature cycle tests and a drop tests. For example, if a WLP package that incorporates embodiments of the invention is used in a portable hand held device, such as a mobile phone, it would be advantageous to use exemplary RDL extensions extending both radially inward and outward from solder joint locations since mobile phones may be subjected to both intense temperature cycling (when left in a hot car or on a ski slope) or shock impulses (when a mobile phone is dropped or accidentally banged against a hard surface). If, for example, a WLP package is being incorporated into a large stationary mainframe computer, then there may be little concern for the WLP being able to withstand a drop test and perhaps only RDL pad extensions 413 extending the RDL pad as seen in FIG. 5 may be needed.

Figure 8:
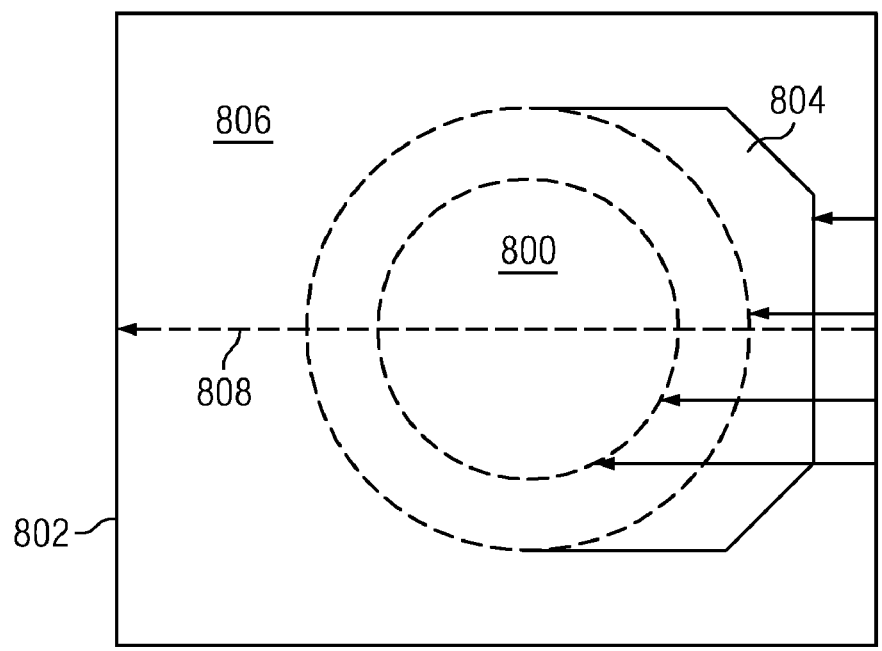
FIG. 8 illustrates a top view of a side portion of an exemplary die having an exemplary RDL pad with expanded geometry or wing.

FIG. 8 depicts an embodiment of the invention wherein the solder joint location 800 is near the center and along an edge 802 of a WLP package. Here the RDL extension or wing 804 expands the geometry of the RDL pad in a manner that is substantially centered about a line 808 extending radially from a central location of the die 806 and then through the center of the solder joint location 800 that coincides therewith.

Figure 9:
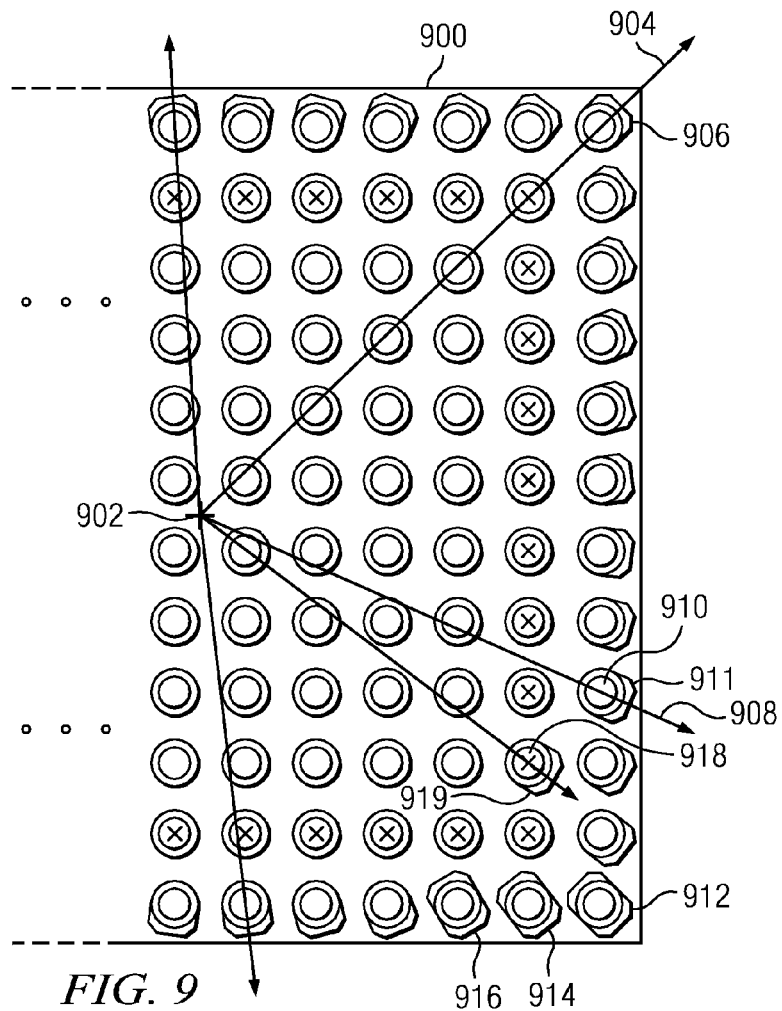
FIG. 9 illustrates an exemplary die having an array of solder joint locations and exemplary expanded RDL pad locations on the die.

Referring now to FIG. 9, an exemplary embodiment of a wafer level package 900 having enhanced redistribution layer pads is depicted. A side of the die 900 is shown having a grid array for solder joint locations. The center of the die 902 has a first radial line 904 extending toward a corner solder joint location where an exemplary expanded geometry RDL pad 906 is shown having an extension extending substantially radially outward and centered with the radial line 904. Another radial line 908 extends from the center point 902 of the die 900 through the center of solder joint location 910 on the outer periphery of the solder ball grid array of the die. This solder joint location has an expanded geometry RDL pad 911 extending the RDL in an outwardly radial direction with respect to the center of the die 902 and the solder joint location 910. The expanded RDL pads 906 and 911 have extensions or wings in a radial outward direction that provide additional RDL surface area that spreads the tensile stresses that occur during TC testing. The RDL pad locations 912, 914 and 916 depict RDL layers that have expanded RDL geometries that include extensions or wings being both radially inward and radially outward from the solder joint location and with respect to the central die location in order to spread tension stress during both the TC and DT testing.

In some embodiments, the RDL wings may be placed on the periphery RDL joint location pads as well as the second row of circumferential solder joint locations indicated by X's in FIG. 9. These second row (or column) locations are considered adjacent to the periphery solder joint locations. Solder joint location 918 depicts a RDL pad layer 919 having an expanded geometry comprising an extension or wing extending radially outward from the center 902 of a die and radially from the solder joint location 918 that will provide enhanced reliability during a TC test and in the field. The expanded geometry of RDL pad 919 may also similarly expand radially inward toward center 902.

FIGS. 6, 7 and 8 depict exemplary RDL pad expanded geometry or RDL extension wing shapes 502, 603 and 804. The geometry or wing shape of FIG. 7 extends in opposing directions about a solder joint location. Also, it should be noted that the width of the wing is essentially the same as the diameter or width of the RDL pad width that is underneath the UBM layer.

Figure 10:
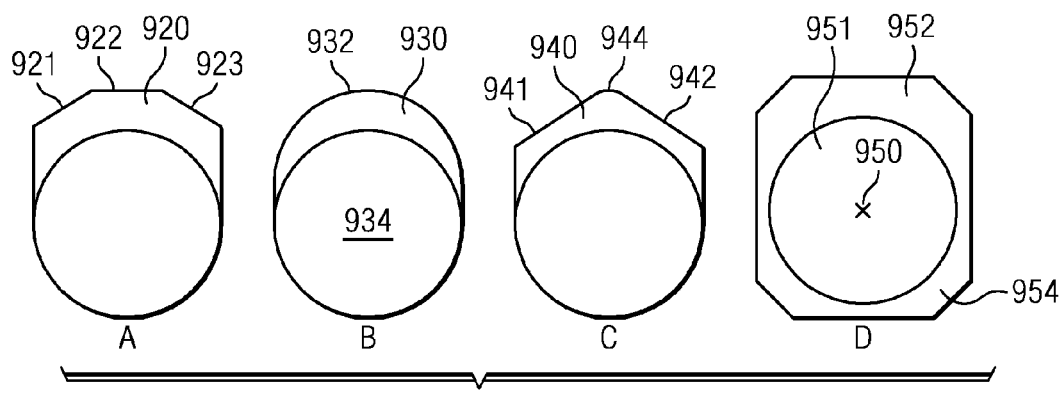
FIGS. 10A, B, C and D illustrate exemplary variations of RDL pads comprising expanded geometries.

FIG. 10 discloses various additional exemplary RDL layer wing extension or expanded geometry configurations. The wing extension 920 is somewhat similar to the wing extension shown in FIG. 8 except that the sides 921, 922 and 923 are each of equal length. Extension 930 has a curved edge 932 that can be the same or of a different curvature as the curve about the round RDL pad area 934. The RDL extension 940 has two sides 941 and 942 having substantially equal lengths with the center or intersection point 944 of the two sides 941 and 942 being rounded so as to minimize possible transmission of high frequencies. Note that the FIG. 10 RDL examples A, B and C each have a wing that is substantially the same width as the diameter or width of the basic or original RDL pad underneath the solder ball and UBM layer. In FIG. 10, item D, an exemplary expanded RDL pad with RDL wings is shown wherein the length of the wings from the center point 950 of the solder ball location 951 is different for the first extension 952 and the second extension 954. Furthermore, the width of the extension is slightly wider (0 to about 20 microns wider) than the basic or original RDL pad or the UBM pad layer. These exemplary RDL layer configurations that are in accordance with embodiments of the invention should not limit the possibility of other RDL extension or expanded geometry shapes about a solder joint location in an exemplary wafer level package, but instead are intended to indicate that the RDL extension shapes may be nearly as wide to a bit wider than a UBM layer width or diameter where a solder ball is to be adjoined to a WLP package. Further variations of the extension sizes and shapes are too numerous to describe but may also help to minimize signal transmission and capacitance that may be associated with exemplary RDL layers at each solder joint location.

Figure 11:
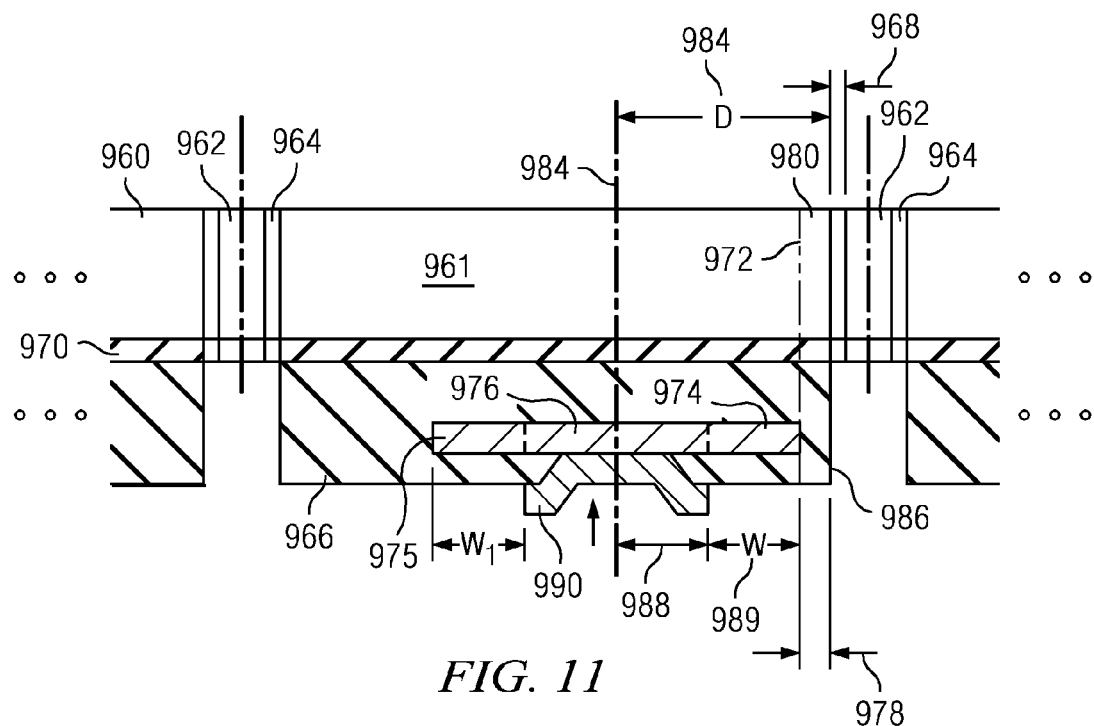
FIG. 11 is a cutaway view of an exemplary silicon wafer in accordance with an embodiment of the invention.

Referring now to FIG. 11, a wafer level package die as part of an exemplary silicon wafer is depicted. FIG. 11 is a portion of a silicon wafer 960. The silicon wafer 960 has completed a manufacturing process wherein one or more individual dies, such as die 961, are manufactured thereon. Between each die is a space called a street 962. Each street represents the portion of the wafer that is expendable when the wafer is mechanically cut into individual dies. At the edge of each street 962 is a small sliver of space referred to as the die edge tolerance 964. The street 962, which includes the die edge tolerance 964, is not generally covered with a dielectric layer 966. When the die 961 is cut out of the wafer 960, the cutting takes place along the street 962 leaving a small die edge tolerance amount 964 at the edge of the die 961. The die edge tolerance may have a width $D_E$ 968, being from about 0 microns to about 50 microns.

Within the die 961, and adjacent to the passivation layer 970 is the active area of the die (not specifically shown). The active area of the die should be covered by the passivation layer 970 and dielectric 966. An active area edge 972 is shown. The active area edge 972 coincides with a maximum distance that an exemplary wing extension 974 of a periphery RDL pad layer 976 can extend from the RDL basic or original pad toward the edge of a die 961. This is important because the end of the RDL wing, like the circuitry in the active area silicon, must be covered by the dielectric 966. If the edge of the wing extends beyond the active area edge 972 toward the street and is exposed after the die 961 is cut from the wafer 960, the exposed end of the wing extension 974 may cool too rapidly or unevenly with respect to the rest of the RDL layer.

The distance between the active area edge 972 and the full width of an uncut street 962 is referred to as the dielectric overlap 980. The dielectric overlap 980 generally has a dielectric measurement (O) 978 of between 7 and about 17 microns.

Through experimentation and computer modeling of exemplary RDL wings such as outer RDL wing extension 974 or inner RDL wing extension 975, it was found that an RDL wing of length (W) 989, measured radially along a line originating from center line 984 extending through an expanded geometry RDL pad, should be about 42 microns +/−28 microns in radial length (not including the basic or original radius 988 of the RDL pad 976). The width of an exemplary inner or outer RDL wing extension 974, 975 should be the same as the diameter or width (2×RDL pad radius 988) of the original or basic RDL pad +/−about 10 microns. The width can be wider or may, for example, spread or fan out as the distance from the solder joint's center increases. If there is room in the die's solder ball grid array, an embodiment may have circumferential wings extending radially about the RDL pad or UBM pad diameter by about 42 microns +/−28 microns. The radial extension about a pad does not have to be the same distance in each radial direction.

In some embodiments wherein an outer RDL wing extension 974 is desired on the exterior most solder ball sites, a maximum ($W_M$) allowable outer RDL wing extension 974 may be calculated using the following calculation:

$$W_M = D - RDL_R - O$$

wherein $W_M$ is equal to the maximum wing extension radial distance. D is the distance between the center of the RDL pad, UBM pad center or solder joint location center 984 and the die edge 986, which coincides with the maximum possible width of the street 962. Thus, D is the distance between the center of a UBM, RDL pad or solder joint location 984 and the maximum street edge or minimum die edge 986. $RDL_R$ is shown as the distance 988, which is equal to the radial length or half the width (diameter) of the RDL pad or, in some embodiments, the UBM pad 990.

Figure 12:
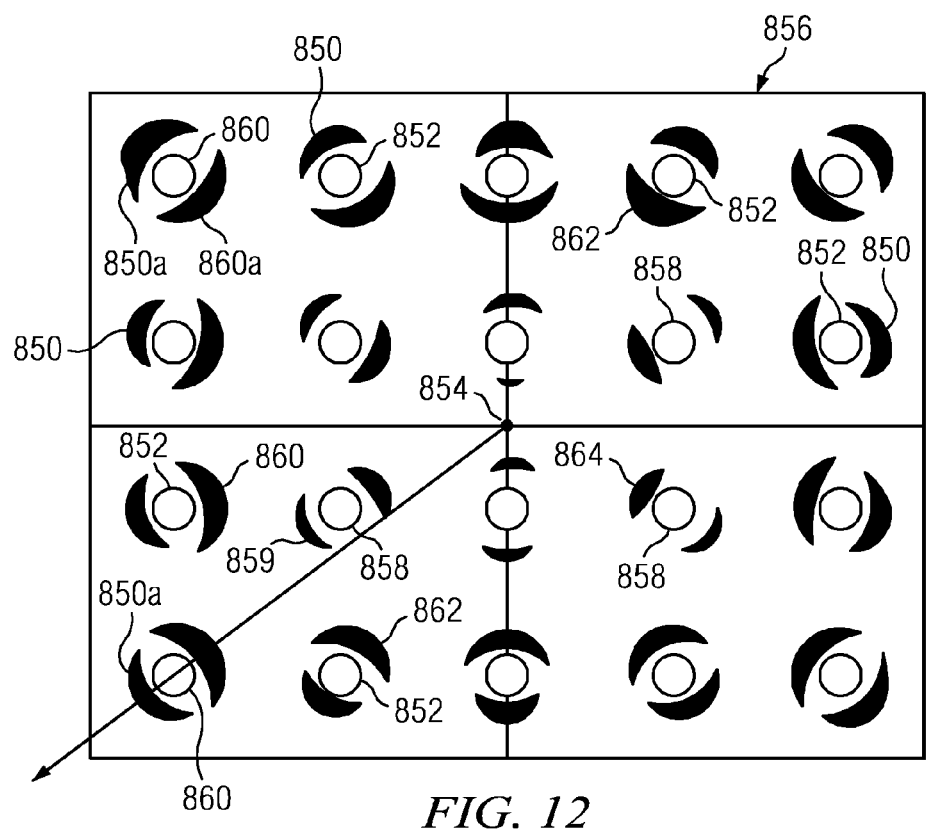
FIG. 12 illustrates TC and DT stresses about solder joint locations on a WLP as determined by a computer simulation.

FIG. 12 shows a finite element computer simulation of stress distribution on a WLP solder joint grid array surface TC and DT cycles. It was found through both the actual temperature cycle testing and computer simulation modeling that stresses due to temperature cycling are adjacent to each periphery solder bump location 852 with the maximum tensile stress force located both radially away from the center of the solder joint location and radially away from the center 854 of the WLP 856. It was further noted that the tensile stress 850 associated with the temperature cycle testing and simulation exhibited the largest magnitudes adjacent to the perimeter solder joint locations (i.e., solder joint locations being centered at locations 852) then the interior solder joint locations (i.e., solder joint locations 858). It was further noted that the corner solder ball locations 860 of the WLP package 856 had larger tensile forces 850a associated therewith than other tensile forces 850 of other perimeter solder joint locations 852. The temperature cycle related tensile forces 859 associated with the interior solder joint locations 858 were smaller than the TC related tensile forces 850 associated with perimeter solder ball locations 852 and 860.

It was also determined that tensile forces associated with the drop test had a maximum tensile force adjacent to a solder ball location 852 and in a direction radially inward toward the center 854 of a WLP 856. The drop test tensile forces 862 about solder ball locations 852 on the perimeter of the WLP 856 were larger than the drop test related tensile forces 864 associated with an interior solder joint location such as solder joint locations 858. The maximum drop test related tensile forces 860a were found adjacent to the corner solder ball locations 860 on the WLP 858. It is noted that the tensile stresses are on radially opposing sides of a solder joint location for DT and TC testing.

Although not specifically shown in FIG. 12, the TC and DT tests and computer modeling of embodiments further indicate tensile forces about a solder joint location decrease as the solder ball joint location is in a row or column further interior from an edge or the perimeter of the WLP package solder joint array. Thus, as discussed earlier with respect to FIG. 9 and supported in the actual testing and computer simulation of the location and magnitude of tensile forces associated with the TC test and DT testing, exemplary RDL extension wings, either inner or outer wings (or expanded RDL geometries), are useful for spreading tensile stresses and decreasing product failure related to temperature or drop stresses when incorporated into the corner and/or periphery-near-corner solder joint locations of WLP packages having a solder ball grid array of 9×9 or smaller. Furthermore, RDL extension wings or expanded geometries in accordance with embodiments of the invention decrease product failure due to temperature cycling or drop testing stresses when part of each solder joint location about the periphery of a WLP solder ball grid array that is 10×10 to about 20×20 in solder ball grid size. In addition, increased mean time between failure is achieved and/or resistance to higher temperature cycling test differentials or larger forces succumbed in a drop test can be achieved by incorporating exemplary RDL pad wings or expanded pad geometries in accordance with embodiments of the invention to both the perimeter solder ball locations on a WLP package as well as to the solder ball locations adjacent to the perimeter solder ball locations (the solder ball locations that are in the rows and columns of the ball grid array that are adjacent to the perimeter solder joint locations). If the incorporation of such inner, outer or outer and inner wings to the solder ball locations located adjacent to the perimeter solder joint locations negatively impacts a need to include certain signal traces on the WLP package between solder ball joint locations, then some embodiments of the invention may selectively place exemplary RDL extensions (inner wings, outer wings or both inner and outer wings) or RDL expanded geometries on the peripheral solder joint locations and other solder joint locations in rows and columns of the WLP package ball grid array that are adjacent to the peripheral solder ball locations with an emphasis on solder ball locations that are near the corners of the WLP package. Also, the expanded RDL geometries can be modified in shape to accommodate signal traces between certain solder joint locations.

RDL pads and geometries in accordance with various embodiments are easily designed into WLP devices since the RDL layer is one of the layers in an integrated circuit that is created by masking the die and sputtering or spraying the RDL metal onto the unmasked portions of the die. Laying out of the RDL mask for embodiments of the invention is done similarly to the technique of creating a RDL mask presently used with the exception of the incorporation of wing extensions about selected or predetermined RDL pad locations.

In some embodiments, the wing extension size depends on the position of the solder joint location to the edge of the die. Furthermore, the RDL wings (inner wings, outer wings, or both inner and outer wings) do not each have to be the same size or area on a WLP. The RDL wing extension size, area or geometry may be adjusted in accordance with the position of the particular RDL pad in the grid array, the need for signal traces between RDL pad locations and the expected tensile forces due to temperature cycling or dropping or jarring of the WLP package when it is incorporated into a final product or device. What is important is that a portion of the RDL layer wing extension area or expanded RDL geometry be positioned to cover at least an area adjacent to a solder joint location that is radially away from both the center of the die and the associated UBM pad for added temperature stress protection. Further, it is important that the RDL extension area or expanded RDL geometry be positioned to cover at least an area adjacent to a solder joint location that is between the center of the die and the associated UBM pad to provide added protection from jarring and impulse tensile stresses from drop testing.

During actual TC reliability testing of embodiments of the invention, the temperature cycle test comprised cycling the temperature of and about an exemplary WLP device (and associated PC board) from −40° C. to 125° C., wherein each cycle had a one hour duration. For prior art WLPs having RDL pads that are about the same size or slightly smaller than the UBM pad, three tests were performed. Each test consisted of 77 new prior art WLP packages that were cycled through 500 temperature cycles. The three temperature cycle tests of the prior art devices resulted in 26, 9 and 14 failures, respectively, for each of the 77 samples in the test.

WLPs in accordance with embodiments of the invention were similarly tested in a temperature cycle test ranging from −40° C. to 125° C. per cycle wherein each cycle had a period of one hour. Three tests were also performed wherein each test included 77 new exemplary WLP packages. After 500 consecutive temperature cycles, none of the exemplary WLPs incorporating embodiments of the invention failed in any of the three sets of 77 new devices. The three sets of 77 devices were then cycled through an additional 500 consecutive temperature cycles totaling 1,000 temperature cycle tests. After the 1,000 temperature cycles, none of the exemplary WLPs having exemplary RDL extension wings or expanded geometries failed the temperature cycle testing.

An additional embodiment of the invention is to have progressively smaller wing extensions (inner, outer or inner and outer wings) or RDL expanded geometries extending either radially inward, outward or both on some or all of the RDL pad locations in each next row and column as the solder ball joint position moves inward from the periphery of the die toward the center. This embodiment will further enhance the mean time between failure and the liability of WLPs as the solder ball grid array size grows larger from 10×10 to arrays of 20×20 solder joint locations. This embodiment's addition of expanded RDL geometries may also provide WLP's that can endure higher temperature changes and rugged environments.

Devices that may benefit from incorporating wafer level packaging in accordance with embodiments of the invention are consumer hand held products such as mobile phones, video recorders, portable DVD players, portable game and gaming devices, hand held GPS devices, lap top computers, mini computers, personal digital assistants (PDAs) and substantially any other hand held device that may be either dropped or used in environments having varying temperatures. Military equipment and devices may also benefit by having higher reliability when embodiments of the invention are incorporated therein. Also, computing systems that may not have to endure drop test like conditions will benefit from exemplary RDL wing extensions or expanded geometries on WLPs to help them withstand temperature cycling and adverse environment conditions.

It will be appreciated by those skilled in the art having the benefit of this disclosure that this redistribution layer enhancement in accordance with the various embodiments of the invention improves the reliability of wafer level packaged devices. It should be understood that the drawings and detailed description herein are to be regarded in an illustrative rather than a restrictive manner, and are not intended to be limiting to the particular forms and examples disclosed. On the contrary, included are any further modifications, changes, rearrangements, substitutions, alternatives, design choices, and embodiments apparent to those of ordinary skill in the art, without departing from the nature and scope hereof, as defined by the following claims. Thus, it is intended that the following claims be interpreted to embrace all such further modifications, changes, rearrangements, substitutions, alternatives, design choices, and embodiments.

What is claimed is:

1. A wafer level package comprising:
an array of solder joint locations on a first side of the wafer level package, wherein at least one solder joint location comprises:
an under ball metal (UBM) layer having a UBM diameter; and
a redistribution layer (RDL) positioned below and adjacent to the UBM layer, the RDL comprising:
an RDL pad area having an RDL pad area width; and
an RDL extension wing area, the RDL extension wing area extends from the RDL pad area in a direction that is both radially outward from a center of the RDL pad area and radially outward from or inward toward a central location of the first side of the wafer level package.

2. The wafer level package of claim 1, wherein the at least one solder joint location comprises solder joint locations proximate to each corner of the wafer level package.

3. The wafer level package of claim 1, wherein the at least one solder joint location comprises solder joint locations about the periphery of the array of solder joint locations.

4. The wafer level package of claim 3, wherein the at least one solder joint location further comprises solder joint locations adjacent to the solder joint locations proximate to each corner of the wafer level package.

5. The wafer level package of claim 3, wherein the at least one solder joint location comprises solder joint locations adjacent to the solder joint locations about the periphery of the array of solder joint locations.

6. The wafer level package of claim 1, wherein the RDL extension wing area extends from the RDL pad area a distance of about 42 microns +/−28 microns.

7. The wafer level package of claim 1, wherein the RDL extension wing area has a width that is similar to the width of the RDL pad area +/−about 10 microns.

8. A wafer level package comprising:
a die having a first side and a second side;
an array of solder joint locations on the first side of the die, the array being arranged in rows and columns;
a redistribution layer (RDL) comprising an RDL pad location at each solder joint location, each RDL pad location having a pad diameter; and
wherein corner RDL pad locations, which coincide with corner solder joint locations of the array, comprise an expanded RDL geometry; each expanded RDL geometry being substantially centered about a line extending radially from a central location on the first side through a center location of the solder joint location that coincides therewith.

9. The wafer level package of claim 8, wherein periphery RDL pad locations, which coincide with solder joint locations about the periphery of the array, comprise expanded RDL geometry being substantially centered about a line extending radially from the central location on the first side through the center location of the solder joint location that coincides therewith.

10. The wafer level package of claim 9, wherein at least one expanded RDL geometry is adapted from being substantially centered about the line when such expanded RDL geometry is adjacent to a signal trace.

11. The wafer level package of claim 8, wherein a plurality of RDL pad locations, which coincide with various solder joint locations about the array, comprise expanded RDL geometry being substantially centered about a line extending radially from the central location on the first side through the center location of the solder joint location that coincides therewith.

12. The wafer level package of claim 11, wherein at least one expanded RDL geometry is adapted from being substantially centered about the line when such expanded RDL geometry is adjacent to a signal trace.

13. The wafer level package of claim 8, wherein each expanded RDL geometry comprises a width that is perpendicular to the line, the width being equal to the pad diameter plus 0 to about 20 microns.

14. The wafer level package of claim 8, wherein each expanded RDL geometry comprises a length that is parallel with the line, the length being divided into an inner length and an outer length, the inner length being measured from the center location of the solder joint location toward the central location and being equal to half the pad diameter plus zero to 70 microns, the outer length being measured from the center location of the solder joint location away from the central location and being equal to half the pad diameter plus 14 to 70 microns.

15. The wafer level package of claim 8, wherein the array of solder joint locations is greater than or equal to an 8×8 array and less than or equal to a 20×20 array.

16. A silicon wafer comprising:
a die being bordered on each side by streets on the wafer, the die having a first side and a second side, the die further comprising:
an array of redistribution layer (RLD) pads each corresponding with an under ball metal (UBM) pad having a UBM center location, wherein a first plurality of the RLD pads, which have central positions in the array, each comprise a circular geometry having an RLD pad diameter and wherein a second plurality of the RLD pads, which have positions about the periphery of the array, each comprise a geometry having a length measured along a first line extending radially from a first side center location through the UBM center location corresponding therewith and having a width measured along a second line, perpendicular to the first line, extending through the UBM center location; wherein the width is equal to the RLD pad diameter plus zero to about 20 microns and wherein the length is equal to the RLD pad diameter plus 14 to about 140 microns.

17. The silicon wafer of claim 16, wherein each length is not necessarily centered about the corresponding UBM center location.

18. The silicon wafer of claim 16, wherein the die further comprises one or more dielectric layers that cover at least the periphery of each RDL pad in the array.

* * * * *